(12) United States Patent
Butler et al.

(10) Patent No.: US 6,373,072 B1
(45) Date of Patent: Apr. 16, 2002

(54) LITHOGRAPHIC PROJECTION APPARATUS

(75) Inventors: Hans Butler, Best; Thomas Petrus Hendricus Warmerdam, Veldhoven, both of (NL)

(73) Assignee: ASM Lithography B.V., Veldhoven (NL)

( * ) Notice: Subject to any disclaimer, the term of this patent is extended or adjusted under 35 U.S.C. 154(b) by 0 days.

(21) Appl. No.: 09/336,677

(22) Filed: Jun. 21, 1999

(30) Foreign Application Priority Data

Jun. 23, 1998 (EP) ............................................ 98202084

(51) Int. Cl.⁷ .......................... H01J 37/08; G01B 11/00
(52) U.S. Cl. ................... 250/492.24; 356/399
(58) Field of Search ................ 250/492.24, 442.11; 364/488; 356/399

(56) References Cited

U.S. PATENT DOCUMENTS 5,696,590 A 12/1997 Makita

FOREIGN PATENT DOCUMENTS

| EP | 634 700 A1 | 1/1995 |
|---|---|---|
| GB | 2 300 275 A | 10/1996 |

Primary Examiner—Jack Berman
Assistant Examiner—K. Fernandez

(74) Attorney, Agent, or Firm—Pillsbury Winthrop LLP

(57) ABSTRACT

A lithographic projection apparatus has a radiation system for supplying a projection beam of radiation, a mask table provided with a mask holder for holding a mask, a substrate table provided with a substrate holder for holding a substrate, a projection system for imaging an irradiated portion of the mask onto a target portion of the substrate, first driving means, for moving the mask table in a given reference direction substantially parallel to the plane of the table, second driving means, for moving the substrate table parallel to the reference direction so as to be synchronous with the motion of the mask table. The lithographic projection apparatus also has a first measuring means, for determining the momentary position of the mask table with respect to a fixed reference point, second measuring means, for determining the momentary position of the substrate table with respect to a fixed reference point, and means for comparing the measured momentary position of the substrate table with a desired momentary position of the substrate table for generating a position error signal in accordance with a difference between the said two positions, and for passing that signal to correction means which serve to adjust the momentary position of the mask table so as to compensate for such difference. In a preferred embodiment, at least a portion of the position error signal is differentiated twice with respect to time before being passed to the correction means, thus providing the correction means with an acceleration error signal which can then be used to directly effect the required correctional acceleration of the mask table.

11 Claims, 3 Drawing Sheets

LITHOGRAPHIC PROJECTION APPARATUS

BACKGROUND OF THE INVENTION

1. Field of the Invention

The invention relates to a lithographic projection apparatus and more particularly a lithographic projection apparatus with reduced effects of disturbances on the motions of substrate and mask tables.

2. Description of Related Art

An apparatus of the above-noted type can be used, for example, in the manufacture of integrated circuits (ICs). In such a case, the mask (reticle) may contain a circuit pattern corresponding to an individual layer of the IC, and this pattern can then be imaged onto a target area (die) on a substrate (silicon wafer) which has been coated with a layer of photosensitive material (resist). In general, a single wafer will contain a whole network of adjacent dies which are successively irradiated through the reticle, one at a time. Each die is irradiated by progressively scanning the reticle pattern under the projection beam in a given reference direction (the "scanning" direction) while synchronously scanning the wafer table parallel or anti-parallel to this direction, thereby transferring an image of the irradiated reticle pattern onto the die. Since, in general, the projection system will have a magnification factor M (generally M<1), the speed at which the wafer table is scanned will be a factor M lower than that at which the reticle table is scanned. More information with regard to lithographic devices as here described can be gleaned from International Patent Application WO 97/33205.

Up to very recently, apparatuses of this type contained a single mask table and a single substrate table. However, machines are now becoming available in which there are at least two independently movable substrate tables; see, for example, the multi-stage apparatuses described in International patent applications WO 98/28665 and WO 98/40791. The basic operating principle behind such multi-stage apparatus is that, while a first substrate table is underneath the projection system so as to allow exposure of a first substrate located on that table, a second substrate table can run to a loading position, discharge an exposed substrate, pick up a new substrate, perform some initial alignment measurements on the new substrate, and then stand by to transfer this new substrate to the exposure position underneath the projection system as soon as exposure of the first substrate is completed, whence the cycle repeats itself; in this manner, it is possible to achieve a substantially increased machine throughput, which in turn improves the cost of ownership of the machine.

Lithographic apparatus may employ various types of projection radiation, such as ultra-violet light (UV), extreme. V, X-rays, ion beams or electron beams, for example. Depending on the type of radiation used and the particular design requirements of the apparatus, the projection system may be refractive, reflective or catadioptric, for example, and may comprise vitreous components, grazing-incidence mirrors, selective multi-layer coatings, magnetic and/or electrostatic field lenses, etc. The apparatus may comprise components which are operated in vacuum, and are correspondingly vacuum-compatible. As mentioned in the previous paragraph, the apparatus may have more than one wafer table and/or mask table.

The manufacture of ICs and other devices with such an apparatus generally involves the replication of extremely fine sub-micron patterns, with an exceptionally high degree of positional accuracy. For this reason, it is essential to properly isolate various critical parts of the apparatus (such as the substrate table and mask table, for example) from spurious motion, vibration, mechanical shocks, etc. In general, this is achieved using such measures as carefully designed metrology frames, air-mounts, motional counter-weights and dampers, which serve to isolate the apparatus' critical parts from most unwanted mechanical influences. However, such measures are not completely effective in eliminating a number of unwanted influences, such as, for example:

1. vibrations caused by mask handling devices (robots);
2. vibrations caused by motion of reticle masking blades;
3. resonance effects caused by the presence of air showers;
4. vibrations in the substrate table caused by motion of the mask table, and vice versa.

Although these effects are relatively small, they become increasingly important as the need to produce ever-higher device resolutions increases, and they now form a substantial barrier to the viable realization of large-area ICs having critical dimensions of the order of 0.15 $\mu$m and less.

SUMMARY OF THE INVENTION

It is an object of the invention to alleviate this problem. More specifically, it is an object of the invention to provide a step-and-scan lithographic projection apparatus in which the effects of the above-mentioned disturbances are reduced. In particular, it is an object of the invention that the said apparatus should contain means to counteract motional a synchronism between the substrate table and mask table arising as a result of such disturbances.

These and other objects are achieved in a lithographic projection apparatus comprising:

a radiation system for supplying a projection beam of radiation;

a mask table provided with a mask holder for holding a mask;

a substrate table provided with a substrate holder for holding a substrate;

a projection system for imaging an irradiated portion of the mask onto a target portion of the substrate;

first driving means, for moving the mask table in a given reference direction substantially parallel to the plane of the table;

second driving means, for moving the substrate table parallel to the reference direction so as to be synchronous with the motion of the mask table.

The apparatus further comprises:

first measuring means, for determining the momentary position of the mask table with respect to a fixed reference point;

second measuring means, for determining the momentary position of the substrate table with respect to a fixed reference point, and means for comparing the measured momentary position of the substrate table with a desired momentary position (setpoint) of the substrate table, for generating a position error signal in accordance with a difference between the said two positions, and for passing that signal to correction means which serve to adjust the momentary position of the mask table so as to compensate for such difference.

The invention is founded upon the insight that the disturbances referred to above are substantially impossible to remove using solely structural alterations to the lithographic apparatus, and that the only practical solution is to employ an approach based on Control Theory. In experiments leading to the invention, the inventors attempted to correct servo errors in the substrate table by using the second measuring means to quantify such errors (by comparing the substrate table's measured and intended positions), and employing a feedback loop to the second driving means to iteratively remove such errors. However, although this approach produced a certain improvement, it failed to remove all unwanted disturbances; further analysis showed that disturbances with characteristic frequencies of the order of about 200 Hz were not being satisfactorily attenuated using this plan of attack, although lower-frequency disturbances (e.g. 20–80 Hz) did demonstrate a reduced amplitude.

In a fresh approach to the problem, the inventors abandoned the idea of attempting to completely remove the effects of unwanted motional disturbances in the substrate table, and turned their attention instead to the mask table. Because the mask table generally has a less complex and more lightweight construction than the substrate table, the inventors expected that the former would have a less complex resonance signature than the latter. Experiments verified that this was indeed the case, but, at frequencies of the order of about 200 Hz, the amplitude of the disturbances in the mask table was substantially equal to that of those in the substrate table.

However, the inventors next arrived at the insight that, since mask features were projected onto the substrate with a magnification M<1 (typically M=¼ or ⅕), the magnitude of mask-table disturbances as seen from the substrate table would be greatly reduced. Instead of trying to wholly eliminate unwanted disturbances from the substrate table, one could thus alternatively attempt to compensate for any residual disturbances by using appropriate mask table adjustments, wherewith the current invention was conceived. Subsequent experiments using this approach yielded excellent results.

In a particular embodiment of the apparatus according to the invention, position errors in the mask table can be combated by using the first measuring means to quantify such errors (by comparing the mask table's measured and intended positions), and employing a feedback loop to the first driving means to iteratively reduce such errors.

An imperfection of the embodiment discussed in the previous paragraph can arise due to the fact that the bandwidth of such a mask-table feedback loop is typically of the order of about 150–175 Hz, which is below the range of frequencies 175–225 Hz characteristic of the most persistent motional disturbances in the apparatus; consequently, if disturbances in this latter frequency range are offered to the input of the mask-table feedback loop, they will not be optimally combated. To circumvent this problem, a preferential embodiment of the apparatus according to the invention is characterized in that at least a portion of the position error signal is differentiated twice with respect to time before being passed to the correction means, thus providing the correction means with an acceleration error signal. This can then be fed directly to the first driving means instead of being offered to the input of the mask-table feedback loop; by multiplying the acceleration error by the mass of the mask table, one immediately obtains the force required to correct the mask table position.

Another embodiment of the apparatus according to the invention is characterized in that at least a portion of the position error signal is passed to the correction means via a lead/lag filter, which filter serves to compensate for any intrinsic temporal inertia (time delay) in the compensation means. This measure ensures that the compensation produced by adjustment of the mask table does not lag behind the original servo error in the substrate table to such an extent as to significantly reduce the image positioning accuracy of the apparatus.

In the light of the discussion in the previous paragraph, it should be noted that the use of an optical fiber link to carry the error signal to the correction means also helps reduce the occurrence of unwanted system lag.

In a particular refinement of the embodiment above, the lead/lag filter is adjusted for optimal performance within that part of the frequency spectrum in which the position error signal has its greatest amplitude. In a specific example, the filter is embodied for optimal performance in the range 175–225 Hz.

In another embodiment of the apparatus according to the invention, position errors in the substrate table are quantified using the second measuring means (by comparing the substrate table's measured and intended positions), and use is made of a feedback loop to the second driving means to iteratively reduce such errors. Such a measure acts in unison with the basic inventive method so as to help reduce inaccuracies in the relative positions of the mask and substrate tables.

In the above, the desired momentary position (setpoint) of the substrate table and/or mask table may, for example, be derived from a (software) setpoint generator which generates a (mathematical) profile for the desired/dictated synchronized motion of the two tables. It should be noted that the fixed reference point with respect to which the position of the substrate table is measured, and the fixed reference point with respect to which the position of the mask table is measured, may be identical or distinct, according to choice.

The invention also relates to a device manufacturing method comprising the steps of:

providing a substrate which is at least partially covered by a layer of radiation-sensitive material;

providing a mask which contains a pattern;

using a projection beam of radiation to project an image of at least part of the mask pattern onto a target area of the layer of radiation-sensitive material.

According to the invention, such a method is characterized in that:

the mask is held on a mask table which is connected to first driving means, for moving the mask table in a given reference direction parallel to the plane of the table;

the substrate is held on a substrate table which is connected to second driving means, for moving the substrate table parallel to the reference direction so as to be synchronous with the motion of the mask table;

using first measuring means, the momentary position of the mask table with respect to a fixed reference point is determined;

using second measuring means, the momentary position of the substrate table with respect to a fixed reference point is determined, and means are employed for comparing the measured momentary position of the substrate table with a desired momentary position of the substrate table, for generating a position error signal in accordance with a difference between the said two positions, and for passing that signal to correction means which serve to adjust the momentary position of the mask table so as to compensate for such difference.

In a manufacturing process using a lithographic projection apparatus according to the invention, a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference has been made hereabove to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

BRIEF DESCRIPTION OF THE DRAWINGS

The invention and its attendant advantages will be further elucidated with the aid of exemplary Embodiments and the accompanying schematic drawings, wherein.

Corresponding features in the various Figures are denoted by the same reference symbols.

DETAILED DESCRIPTION OF THE PREFERRED EMBODIMENTS

Embodiment 1

Figure 1:
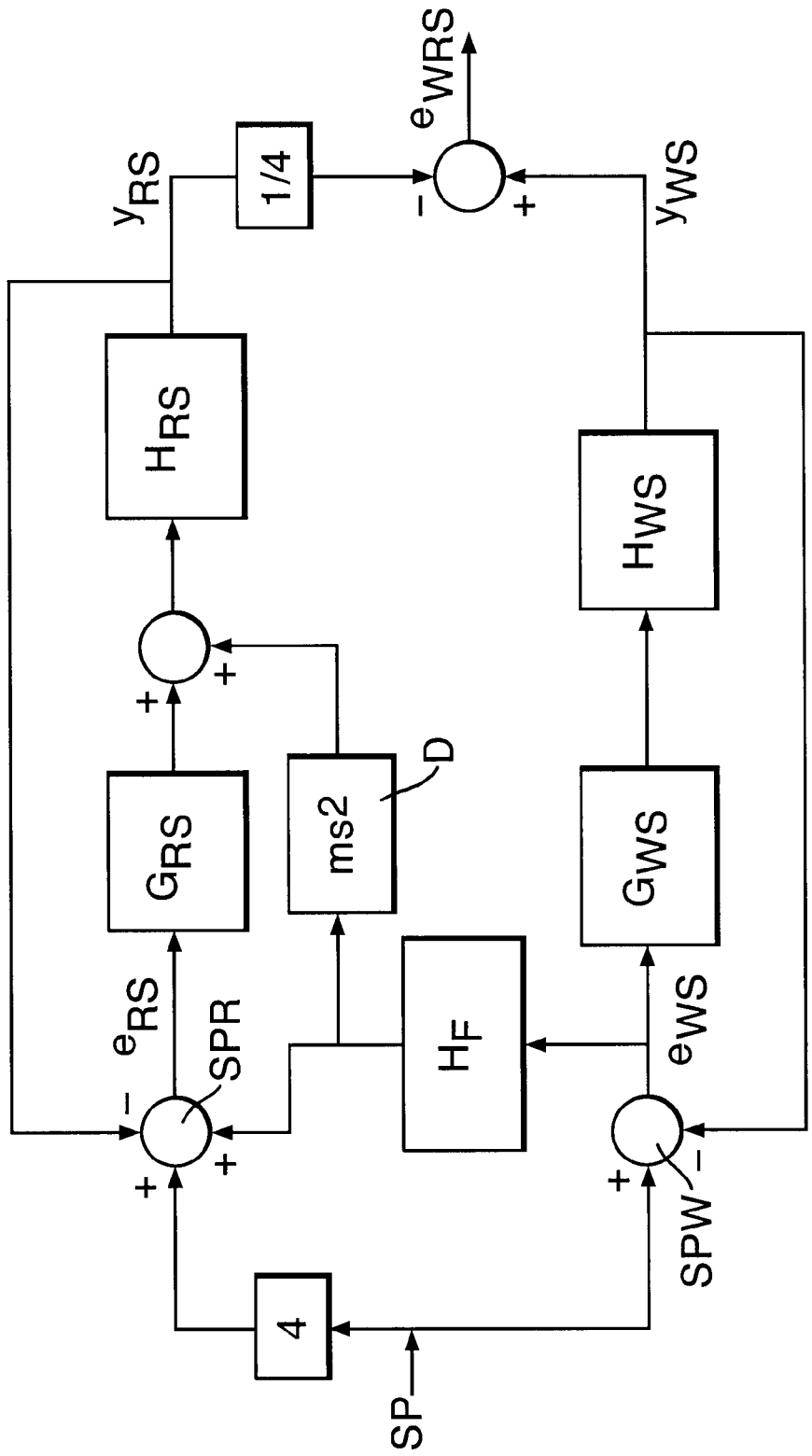
FIG. 1 is a schematic representation of a Control Theory circuit suitable for implementation in an apparatus according to the invention.

FIG. 1 depicts a particular embodiment of a correctional schematic for use in an apparatus according to the invention. The top loop represents the mask table (or reticle stage: RS), consisting of the mechanical transfer $H_{RS}$ and controller $G_{RS}$. The bottom loop is the substrate table (or wafer stage: WS), consisting of the mechanical transfer $H_{WS}$ and controller $G_{WS}$. The reticle stage receives 4× the setpoint SP of the wafer stage, while its output only counts ¼ in the relevant WS/RS error.

In addition to a low-pass filter $H_F$ (With gain−4) which feeds the WS error $e_{WS}$ to the RS setpoint SPR, a double differentiator D generates the WS acceleration error. By multiplication of this acceleration by the RS mass (m), an extra force is generated which, when applied to the reticle stage, should give the RS the same acceleration as the WS. $H_F$ may also contain a lead/lag component to optimize the feedthrough in a specific frequency range, as discussed further in Embodiment 2 below.

When applied on its own, the RS controller would consider this force a disturbance, and would react and try to diminish the effect of the feedforward. By additionally feeding the filtered WS error to the RS setpoint, this problem is solved. Now, if the RS reacts to the extra feedforward force as a transfer $1/Ms^2$, the RS error $e_{RS}$ remains zero and hence the RS controller is left "unaware" of any extra force injection.

The main advantage of this feedthrough form is its independence of the RS bandwidth. Even with low bandwidths, the extra force feedforward creates the required RS response. Only when the RS dynamics deviate from the ideal $1/ms^2$ will the RS response become non-ideal.

Note that, for implementation purposes, the actual filter architecture can be chosen slightly differently. For example, two filters having the same denominator polynomial can be used; in that case, only the numerator differs, the low-pass filter having only a gain, the high-pass filter having the term $m.s^2$.

Embodiment 2

When using the feedthrough method shown in FIG. 1, the main cause of residual WS/RS error is the phase difference at higher frequencies. This phase lag is caused by the remaining delay in the path from WS error to RS.

Figure 2A:
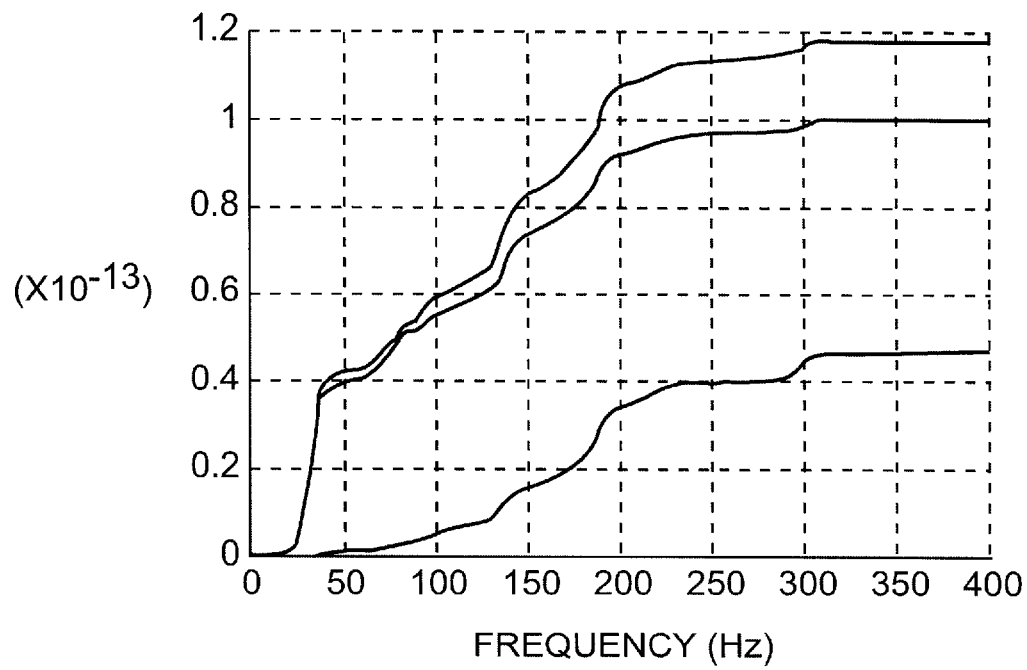
FIGS. 2A and 2B depict the frequency response of the mask table and substrate table in a particular embodiment of an apparatus according to the invention.
Figure 2B:
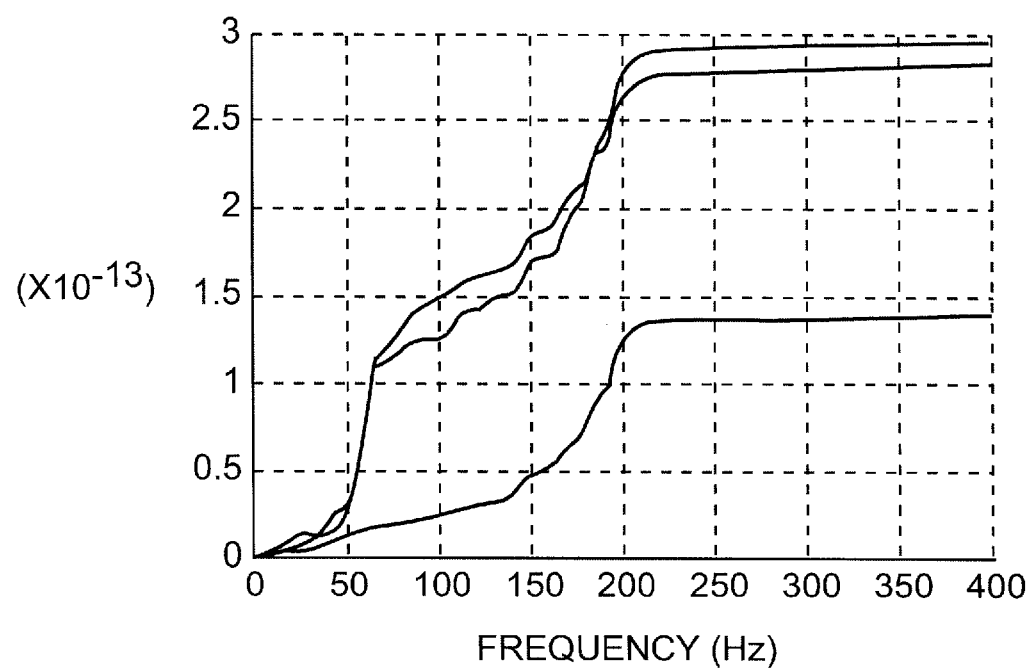

FIGS. 2A and 2B show the frequency spectra of the WS position error (top line), of the RS position error divided by 4 (just below top line), and of the net error at WS level (bottom line), in the orthogonal directions X (FIG. 2A) and Y (FIG. 2B) defining the plane of the WS, Y being the scanning direction. The horizontal axes depict frequency in Hz; the numbers along the vertical axes are ×10$^{-13}$. As can be seen, the RS follows the WS quite accurately when it comes to the amplitude of the error. Particularly at low frequencies, this results in a residual WS/RS error of relatively small magnitude. However, for frequencies between 175 and 225 Hz, although the RS error matches the WS error fairly well in amplitude, the residual error becomes relatively large. This effect is most obvious in the Y direction. This rise of the net error is caused by the phase difference between the WS error and the RS reaction.

Decreasing the phase difference by adding a lead/lag filter improves the net error at WS level. After various optimization cycles, a lead/lag filter was selected having damping ratios of 0.3 for both numerator and denominator (so as to keep the overshoot low), with a zero frequency at 175 Hz and a pole frequency at 205 Hz.

The table below shows the magnitude of the net WS/RS errors obtained using such a filter (column "filter"), as compared to the results obtained using a set-up as depicted in FIG. 1 (column "loop") and the raw results obtained without application of the current invention (column "uncorrected"). MA and MSD are the moving average and moving standard deviation, respectively. All figures are in nm, and are quoted for the X and Y directions discussed above.

|       | Uncorrected | Loop | Filter |
|-------|-------------|------|--------|
| MA X  | 11.4        | 1.4  | 1.0    |
| MSD X | 14.9        | 7.9  | 6.9    |
| MA Y  | 4.3         | 1.6  | 1.1    |
| MSD Y | 22.7        | 15.8 | 9.3    |

Embodiment 3

Figure 3:
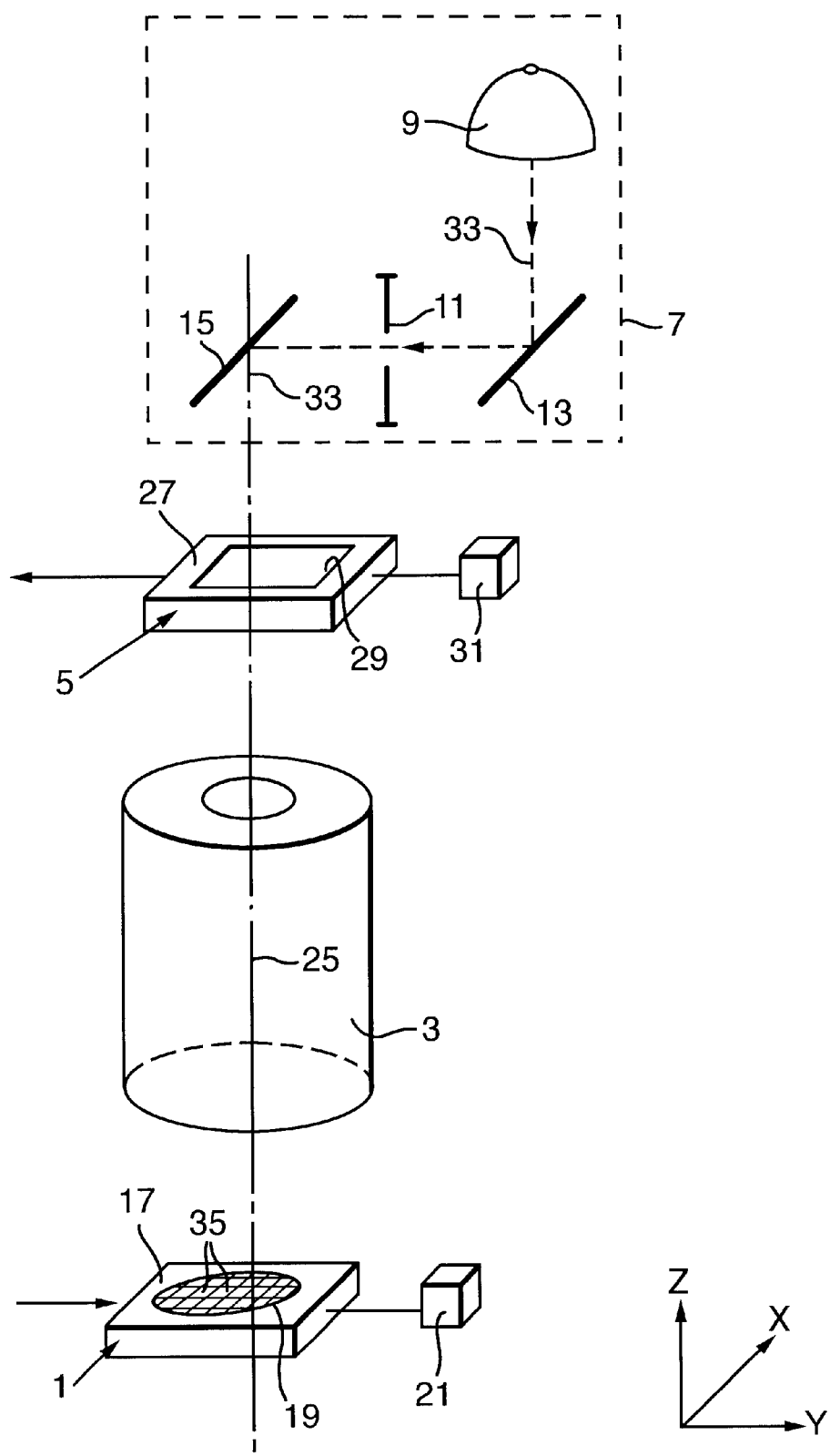
FIG. 3 renders a general schematic view of an apparatus according to the invention.

FIG. 3 renders a schematic perspective view of a lithographic projection apparatus according to the invention. The apparatus comprises:

a radiation system 7 for supplying a projection beam 33 of radiation (e.g. ultraviolet light, EUV, X-rays or a charged particle beam);

a mask table 5 provided with a mask holder 27 for holding a mask 29 (e.g. a reticle);

a substrate table 1 provided with a substrate holder 17 for holding a substrate 19 (e.g. a resist-coated silicon wafer);

a projection system 3 (e.g. a lens or catadioptric system, a mirror group, or a charged particle imaging system) for imaging an irradiated portion of the mask 29 onto a target portion 35 (die) of the substrate 19.

As here depicted, the apparatus is transmissive, i.e. contains a transmissive mask and projection system. However, the apparatus may also be reflective, with a reflective mask and/or projection system, for example.

The radiation system 7 comprises a source 9 (e.g., a Hg lamp or excimer laser, a charged particle source (such as a thermionic cathode), or an undulator provided around the path of an electron beam in a storage ring or synchrotron) which produces a beam 33 of radiation. This beam 33 is passed along various illuminator components 11,13,15 so that the beam 25 emerging from the system 7 is substantially collimated and uniformly intense throughout its cross-section.

The projection beam subsequently intercepts a reticle 29 which is held in a mask holder 27 on a mask table 5. With the aid of first driving means 31, the mask table 5 can be moved accurately back and forth along the Y-direction (the so-called scanning direction).

Having passed through the reticle 29, the projection beam passes through a projection system 3, which focuses the beam 25 onto a die 35 of the wafer 19. With the aid of second driving means 21, the substrate table 1 can also be moved accurately back and forth along the Y-direction (scanning direction). The substrate table 1 can also be moved back and forth in the X-direction, and additionally has other degrees of freedom.

During a scan, the reticle table 5 is moved in the scan direction with a speed v, so that the projection beam is caused to scan over a reticle image. Simultaneously, the substrate table 1 is moved in the same or opposite direction at a speed V=Mv, in which M is the magnification of the projection system 3 (typically, M=¼ or ⅕). In this manner, a relatively large die can be exposed, without having to compromise on resolution.

The current invention is implemented in this set-up to help ensure proper synchronization of the scanning motion of the mask table 5 and substrate table 1, as explained in Embodiment 1.

We claim:

1. A lithographic projection apparatus comprising:

a radiation system for supplying a projection beam of radiation;

a mask table provided with a mask holder for holding a mask;

a substrate table provided with a substrate holder for holding a substrate;

a projection system for imaging an irradiated portion of the mask onto a target portion of the substrate;

first driving means, for moving the mask table in a given reference direction substantially parallel to the plane of the table;

second driving means, for moving the substrate table parallel to the reference direction so as to be synchronous with the motion of the mask table;

first measuring means, for determining the momentary position of the mask table with respect to a fixed reference point;

second measuring means, for determining the momentary position of the substrate table with respect to a fixed reference point, and means for comparing the measured momentary position of the substrate table with a desired momentary position of the substrate table, during a scanning movement of the substrate table, for generating a position error signal in accordance with a difference between said two positions, and for passing said position error signal to correction means which serve to adjust the momentary position of the mask so as to compensate for such difference.

2. An apparatus according to claim 1, wherein at least a portion of the position error signal is differentiated twice with respect to time before being passed to the correction means, thus providing the correction means with an acceleration error signal.

3. An apparatus according to claim 1, wherein at least a portion of the position error signal is passed to the correction means via a lead/lag filter, which filter serves to compensate for any intrinsic temporal inertia in the compensation means.

4. An apparatus according to claim 3, the filter is adjusted for optimal performance within that part of the frequency spectrum in which the position error signal has its greatest amplitude.

5. An apparatus according to claim 3, wherein the filter is adjusted for optimal performance within the frequency range 175–225 Hz.

6. An apparatus according to claim 1, further comprising a first a comparator for comparing the measured momentary position of the mask table with a desired momentary position thereof, for generating a first signal dependent on any difference between these two positions of the mask table, and for passing that signal to the first driving means so as to adjust the momentary position of the mask table and thus reduce said difference.

7. An apparatus according to claim 6, further comprising a second comparator for comparing the measured momentary position of the substrate table with a desired momentary position thereof, for generating a second signal dependent on any difference between these two positions of the substrate table, and for passing that signal to the second driving means so as to adjust the momentary position of the substrate table and thus reduce said difference.

8. An apparatus according to claim 1, wherein the position error signal is passed to the correction means via an optical fiber link.

9. A device manufacturing method, comprising:

projecting an image of at least a portion of a mask which contains a pattern onto a target area of a layer of radiation-sensitive material on a substrate;

moving a mask table in a given reference direction parallel to a plane of the mask table;

moving a substrate table supporting the substrate parallel to the reference direction so as to be synchronous with motion of the mask table;

determining a momentary position of the mask table with respect to a fixed reference point;

determining a momentary position of the substrate table with respect to a fixed reference point;

comparing the measured momentary position of the substrate table with a desired momentary position of the substrate table, during a scanning movement of the substrate table;

generating a position error signal in accordance with a difference between said two positions; and adjusting the momentary position of the mask table so as to compensate for said difference.

10. A device manufactured in accordance with a method comprising:

projecting an image of at least a portion of a mask which contains a pattern onto a target area of a layer of radiation-sensitive material on a substrate;

moving a mask table in a given reference direction parallel to a plane of the mask table;

moving a substrate table supporting the substrate parallel to the reference direction so as to be synchronous with motion of the mask table;

determining a momentary position of the mask table with respect to a fixed reference point;

determining a momentary position of the substrate table with respect to a fixed reference point;

comparing the measured momentary position of the substrate table with a desired momentary position of the substrate table, during a scanning movement of the substrate table;

generating a position error signal in accordance with a difference between said two positions; and adjusting the momentary position of the mask table so as to compensate for said difference.

11. A lithographic projection apparatus comprising:

a radiation system;

a substrate table disposed intercepting a path of beam of radiation supplied by said radiation system, said substrate table having a substrate holder;

a mask table disposed intercepting said path of said beam of radiation between said radiation system and said substrate table, said mask having a mask table holder;

a projection system disposed intercepting said path of said beam of radiation between said mask table and said substrate table;

a first drive unit mechanically coupled to said mask table, said first drive unit selectively providing a drive force on said mask table;

a second drive unit mechanically coupled to said substrate table, said second drive unit selectively providing a drive force on said substrate table;

a mask-table-position measuring device disposed proximate said mask table, said mask-table-position measuring device providing a substantially instantaneous position of said mask table with respect to a fixed reference point;

a substrate-table-position measuring device disposed proximate said substrate table, said substrate-table-position measuring device providing a substantially instantaneous position for said substrate table with respect to a fixed point;

a comparator in communication with said substrate-table-position measuring device, said comparator generating a position error signal in accordance with a difference between said substantially instantaneous position of said substrate table and a desired instantaneous position of said substrate table, during a scanning movement of said substrate table; and a correction unit in communication with said comparator and said first drive unit, said correction unit providing a signal to said first drive unit to impose a force on said mask table to correct an error, in relative positions between said mask table and said substrate table.

* * * * *